United States Patent [19]

Ohkubo

[11] 4,194,148

[45] Mar. 18, 1980

[54] MEASURING APPARATUS FOR MEASURING A CHARGING DEGREE OF LIQUID

[75] Inventor: Hitoshi Ohkubo, Anjo, Japan

[73] Assignee: Tokyo Shibaura Electric Co., Ltd., Kawasaki, Japan

[21] Appl. No.: 872,119

[22] Filed: Jan. 25, 1978

[51] Int. Cl.² ............... G01R 5/28; G01R 29/12; G01N 27/60
[52] U.S. Cl. .................................................. 324/453
[58] Field of Search .................... 324/32, 54, 71, 72

[56] References Cited

U.S. PATENT DOCUMENTS

| | | | |
|---|---|---|---|
| 2,315,805 | 4/1943 | Mayo et al. | 324/32 X |
| 3,306,320 | 2/1967 | Bond | 324/32 X |
| 3,368,144 | 2/1968 | Gerdes | 324/32 |
| 3,384,813 | 5/1968 | Ginsburgh et al. | 324/32 |
| 3,405,722 | 10/1968 | Carruthers et al. | 324/32 X |
| 3,502,965 | 3/1970 | Gerdes et al. | 324/32 |

Primary Examiner—Gerard R. Strecker
Attorney, Agent, or Firm—Oblon, Fisher, Spivak, McClelland & Maier

[57] ABSTRACT

A measuring apparatus for measuring the charging degree of a liquid is provided with a casing accommodating an insulating material in the middle of a circulating system in which a base liquid is circulated.

The charging degree of a test liquid is measured by the change of a charging quantity when the test liquid is injected by a syringe in the circulating system while a charging quantity which occurs from friction between the insulating material in the casing and the flowing base liquid is detected.

10 Claims, 3 Drawing Figures

MEASURING APPARATUS FOR MEASURING A CHARGING DEGREE OF LIQUID

BACKGROUND OF THE INVENTION

1. Field of the Invention

This invention relates to a measuring apparatus for measuring a charging degree of liquid, and more particularly to a measuring apparatus which is adapted to measure a charging degree of liquid used in the electric field as an insulated oil or in the petrochemical field.

2. Description of the Prior Art

It is well-known phenomenon the (so called fluidity-static electricity-phenomenon) that static electricity is generated by the fluidity of a fluid. In this case, the generation of the static electricity is changed according to the kind of liquid, water, oil, alcohol being one large classification and insulating oil, lubricating oil being another small classification.

Furthermore, even if the kind of liquid is the same, the generation of static electricity is changed by differences for example such or the difference between the mineral oil and the synthetic oil in the insulating oil used for a transformer, difference of quantity of annex, impurities, or difference of a little component, such as difference between new oil and old oil.

A method in which the charging degree of a liquid is determined by the electric conductivity of the liquid has often been utilized.

However, since it is confirmed that there is a case in which the generation of the static electricity is changed even if the electric conductivity of two liquids is same, and since the electric conductivity is not greatly changed if a component of two liquids generally differs a little in the same kind of the liquid, it is difficult to determine the charging degree of the liquid by using this method.

It should be readily apparent that a method in which the charging degree of the liquid is determined by using the dielectric loss tangent (or dielectric dissipation factor $= \tan \delta$) suffers from the same disadvantage.

Now, a method in which the liquid to be measured is compressed and the compressed liquid flows down in a container disposed between a pair of electrodes so as to cause the liquid to pass between the two electrodes has been utilized.

This method, however, suffers in that it is not easy to build an apparatus of the enclosed type and, therefore, is influenced by the environment no little.

Furthermore, in the event the charging degree of some kind of liquid is measured, it has the disadvantages that it is necessary to provide several measuring apparatuses, or that it is necessary many times to wash the used container after measuring.

SUMMARY OF THE INVENTION

Accordingly, it is one object of this invention to provide a new and improved measuring apparatus which an measure the charging degree of a liquid in as short a time as possible.

Another object of this invention is to provide a new and improved measuring apparatus which can measure the charging degree of a liquid without influence by the environment.

Briefly, in accordance with one aspect of this invention, a measuring apparatus is provided which includes an enclosed circulating system for circulating a base liquid, static electricity generating means having a member interposed in the middle of the circulating system to cause generation of static electricity by contact friction with the base liquid, detecting means for detecting the static electricity generated in the static electricity generating means, and injecting means for injecting a liquid to be measured upstream of the position of the static electricity generating means in the circulating system.

BRIEF DESCRIPTION OF THE DRAWINGS

A more complete appreciation of the invention will be readily obtained as the same becomes better understood by reference to the following detailed description when considered in connection with the accompanying Drawings, wherein.

DESCRIPTION OF THE PREFERRED EMBODIMENTS

Figure 1:
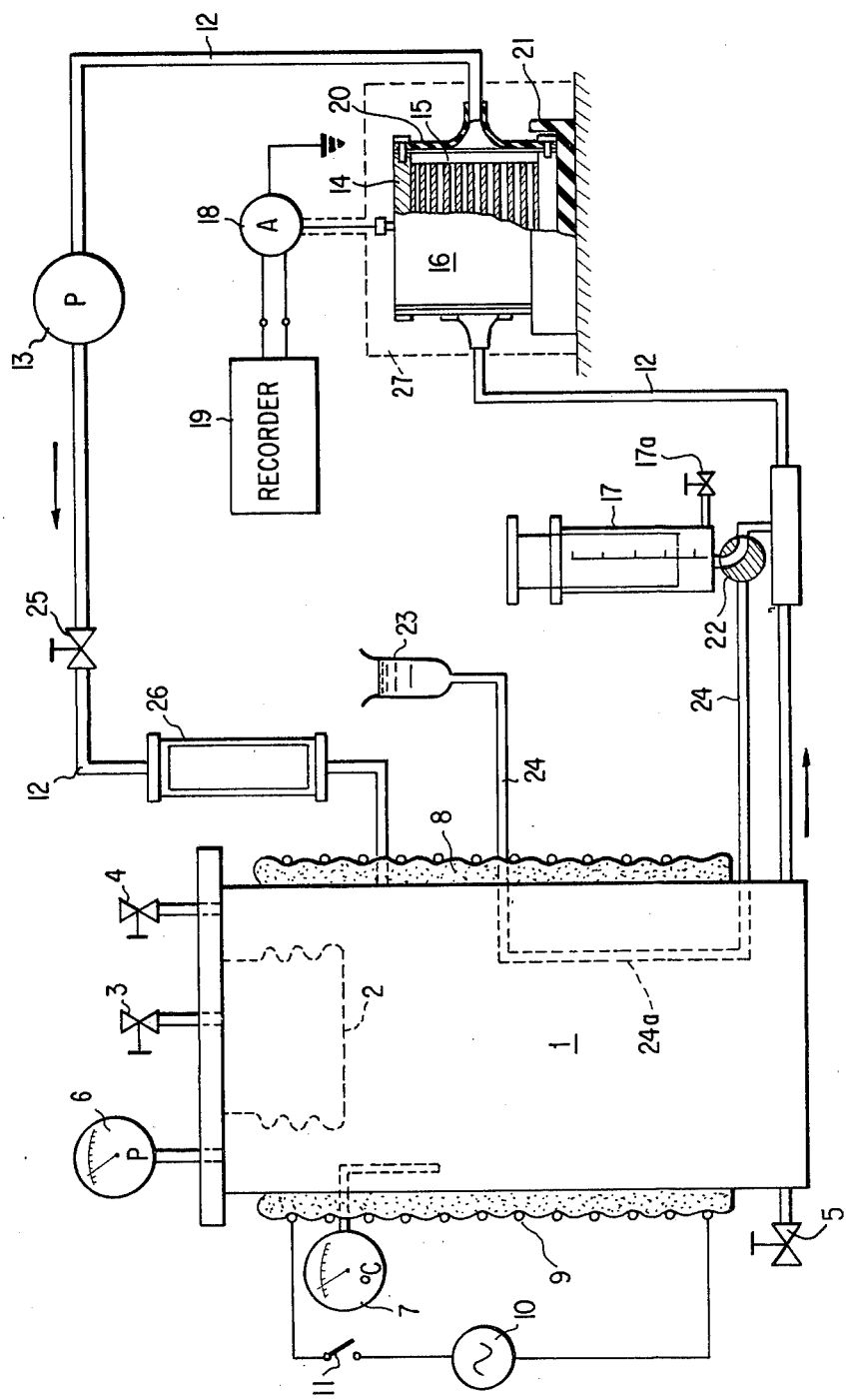
FIG. 1 is a diagrammatic view of a preferred embodiment of a measuring apparatus for measuring a charging degree of liquid according to this invention.

Referring now to the Drawings, wherein like reference numerals designated identical or corresponding parts throughout the several views, and more particularly to FIG. 1 thereof, one preferred embodiment of a measuring apparatus for measuring the charging degree of a liquid in accordance with this invention is shown as including a tank 1 which is filled up by an insulating oil as a base liquid therein.

On the upper side of the tank 1 a bellows 2 to adjust the pressure in the tank 1, and an N valve 3, to enclose nitrogen gas in the bellows 2, are attached.

Furthermore, to the tank 1 a V valve 4, to make the inside of the tank 1 a vacuum, a B valve 5, to inject or draw out the base liquid, a pressure gauge 6 and a thermometer 7 are attached respectively. In order to adjust the temperature of the base liquid, a heater 9 is provided on the walls of the tank 1 through a keeping warm material 8. This heater 9 is connected to a power supply 10 and switched by a switch 11.

A piping 12, which constitutes an enclosed, i.e. closed, circulating system, is communicated with the tank 1. This piping 12 is preferably made of a stainless steel which is not influenced by the fluidity-static electricity-phenomenon.

A relaxation tank 1 is installed to leak all charges in the base liquid. The charge in the flowing liquid is relaxed in the relaxation tank 1.

In the middle of the piping 12 constituting a part of the circulating system a pump for example a trochoid pump 13, which generates a high pressure, is attached and the base liquid is circulated by the operation of the pump 13 as shown in the direction of the arrow.

In the middle of the piping 12 located upstream of the position of the pump 13, are mounted a static electricity generating device 16, accommodating an insulating member 15 in a cylindrical metal case 14, and a syringe 17, which is located further upstream than the position of the static electricity generating device 16 in order to inject the liquid to be measured .

The insulating member 15 of the static electricity generating device 16 is spun and by passing the base liquid through a gap between the spinning member and the case, static electricity is generated on the insulating member by contact friction between the base liquid and the insulating member 15.

The generated static electricity is removed from the insulating member 15 to the metal case 14 connected therewith and then is detected by an ammeter 18 connected with the case 14 as a current of static electricity.

Furthermore, the current value is recorded by the recorder 19 connected with the ammeter 18. The magnitude of the current of the generated static electricity is very small.

Accordingly, the static electricity generating device 16 is formed with a cover 20 of a high resistance insulator connecting the case 14 and the piping 12 to insulate against the piping being earthed and is also formed with an insulating frame 21 on which the case 14 is mounted to insulate it against grounding, whereby the leakage of static electricity is prevented.

The ammeter preferably used is a vibrating capacitance type. The syringe 17 has a deflation valve 17a to deflate the air therefrom and the pointed end of the syringe 17 is communicated with the piping 12 through the one connecting inlet of a bi-directional valve 22.

Another connecting inlet of the two-directional valve 22 is communicated through a piping 24 with a tank 23 accommodating the liquid to be measured.

The liquid to be measured is first sucked in from the tank 23 to the syringe 17 by switching of the bi-directional valve 22.

The liquid is then injected from the syringe 17 to the piping 12 by switching of the bi-directional valve 22. A part 24a of the piping 24 is passed through the tank 1 in order to set the temperatures of the liquid accommodated in the container 23 and the base liquid substantially same.

In order to adjust the flow of the circulating base liquid a flow adjusting valve 25 and a flow meter 26 are mounted downstream of the position of the pump 13 of the piping 12.

Now, the operation of the measuring apparatus for measuring a charging degree of the liquid according to this invention will be explained. It is assumed that the base liquid is an unused insulating oil for a transformer, the liquid to be measured is a used insulating oil in a transformer and the insulating member 15 of the static electricity generating device 16 is an insulating paper.

The base liquid in the circulating system is circulated by the pump 13 as shown in direction of arrow. If the flow of the base liquid maintains constant, the current flowing in the ammeter generated by the fluidity-static electricity-phenomenon between the insulating paper and the flowing insulating oil is constant. In this case in order to eliminate various errors from the measured current the resistance to ground of the insulating material i.e. the cover 20 and the insulating frame 21 is preferably sufficiently larger than the inner resistance of the ammeter 18. According to circumstances the static electricity generating device 16 may be covered with a shield 27 as shown in dotted line of FIG. 1.

In this stable state a constant current is obtained, thus after the liquid to be measured is poured into the container 23 a constant quantity (such as 50 ml) of the liquid is injected into the piping 12 of the circulating system by the syringe 17 after operating the bi-directional valve 22.

If there is a difference between charging degrees of the injected liquid and the base liquid, then a change of the static electricity generating by its difference is indicated to the ammeter 18. That is to say, if the charging degree of the liquid to be measured is higher than that of the base liquid, the detected current shows an upward change. On the contrary, if the charging degree is lower than that of the base liquid, the detected current shows a downward change.

Figure 2:
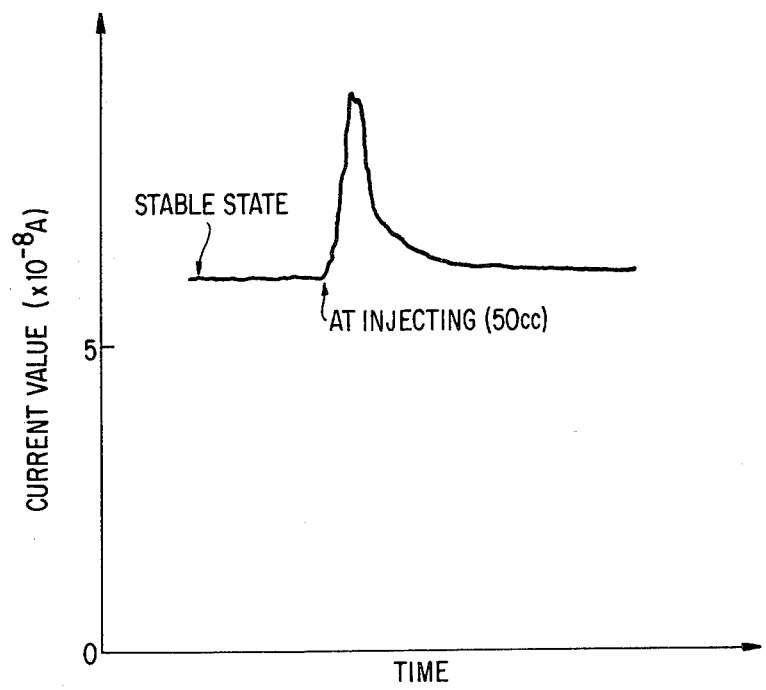
FIG. 2 is a graph showing relationship between time and current value measured by the measuring apparatus for measuring a charging degree of liquid according to this invention.

The graph shown in FIG. 2 indicates that since the detected current is upwardly changed the charging degree of the insulating oil used for this measurement is higher than that of the base liquid.

According to this invention it is possible to determine a magnitude of the charging degree of the liquid to be measured per the base liquid by the change of current of the ammeter 18 on injecting the liquid to be measured into the circulating system. Moreover, it is possible to understand the value of the charging degree of the measured liquid by the magnitude of the change indicated by the ammeter 18. Furthermore, it is possible to instantly obtain the value of the charging degree of the insulating oil in a large transformer if the insulating oils used for various transformers are measured.

The required quantity of the liquid to be injected into the circulating system is about 10 ml to 100 ml. Since this injecting quantity is only at maximum 0.4 percent of the quantity of the base liquid (such as about 25 l), the static electricity generated by the base liquid is not abnormally influenced so long as a liquid of extremely different charging degree than that of the base liquid is not injected into the circulating system.

According to this invention, therefore, it is possible to reduce the time necessary to measurement since some kind of liquid to be measured is continuously injected without cleaning up the measuring apparatus every measuring time and without exchange of the base liquid whereby each of the charging degrees of the liquids can be measured.

If the liquid to be measured and the base liquid is set by the heater 9 at a predetermined temperature, it is possible to compare at the same level the value measured in the winter with the value measured in the summer with respect to same transformer. On the contrary, it will be apparent that the case in which a charging degree of the insulating oil of a transformer located on a cold area is measured is similar to that described above.

According to this invention, since the relaxation tank 1 is provided between the pump 13 and the injecting means 17 (i.e. the charge in the outlet of the pump 13 is relaxed in the relaxation tank 1), there is no charge of the base liquid in the outlet of the relaxation tank 1. It is therefore, possible to always accurately measure the charging degree of the liquid.

Figure 3:
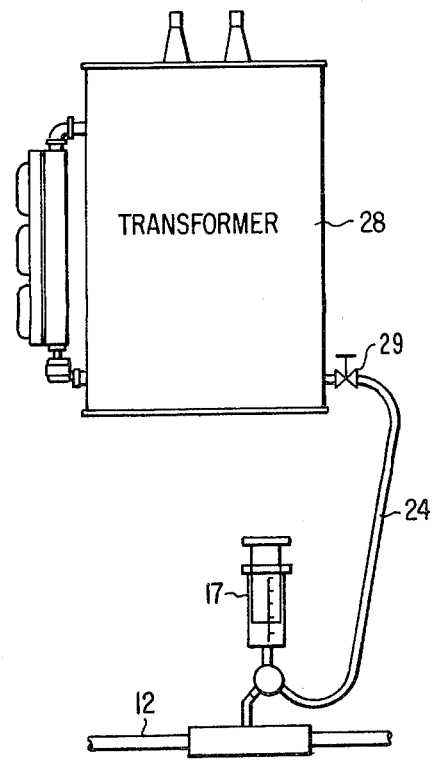
FIG. 3 is a diagramatic view of another embodiment of the measuring apparatus according to this invention.

It has been explained that the liquid to be measured is accommodated in the container 23 as shown in FIG. 1. As shown in FIG. 3, the piping 24 may be communicated with the syringe 17 directly connected to a transformer 28 filled with the liquid to be measured through a T valve 29. Thus, as a result thereof, the insulating oil in the transformer 28 can be injected into the circulating system of the measuring apparatus without exposure to the atmosphere.

Although this invention has been explained by way of the example of measuring a charging degree of the insulating oil used for a transformer, it is possible to adapt it to measure the charging degree of a combustible liquid flowing in the pipeline of the petrochemical plant.

According to this invention, since the liquid to be measured is injected into the enclosed circulating system wherein is flowing the base liquid, and the charging degree of the liquid to be measured can be measured by the difference between changing degrees of the base liquid and the liquid to be measured, the measuring apparatus for the charging degree of a liquid can be constituted as an enclosed type whereby it is not influenced by its environment. Moreover, since some kind of liquid to be measured can be continuously measured, it is possible to reduce the time necessary to measurement.

Obviously, many modifications and variations of the present invention are possible in light of the teachings of this invention.

What is claimed as new and desired to be secured by Letters Patent of the United States is:

1. A measuring apparatus for measuring the charging degree of a liquid comprising:
    a closed circulating system for circulating a base liquid, the closed circulating system including a tank for containing a base liquid, said tank including inlet means for receiving a supply of said base liquid, a piping having two ends in fluid communication with the tank, and a pump attached in the piping to draw the base liquid from the tank through the piping and back to the tank;
    static electricity generating means coupled to said piping and having a member interposed in the middle of the circulating system for causing static electricity to be generated by constant friction with the circulating base liquid;
    detecting means for detecting the static electricity generated in the static electricity generating means; and
    injecting means coupled to said piping and disposed upstream of the position of the static electricity generating means and downstream of said tank in the circulating system for injecting into the circulating base liquid a small quantity relative to the quantity of circulating base liquid of a liquid whose charging degree is to be measured;
    whereby any difference in static electricity caused by charging of the injected liquid whose charging degree is to be measured is detected by the detecting means to provide an indication of the charging degree of the injected liquid.

2. Measuring apparatus according to claim 1, wherein the piping is a stainless steel.

3. A measuring apparatus according to claim 1, wherein the member of the static electricity generating means is a spinning type.

4. A measuring apparatus according to claim 1, wherein the detecting means comprises a case accommodating the member of the static electricity generating means and an ammeter connected to the case.

5. A measuring apparatus according to claim 4, which further includes a recorder connected to the ammeter.

6. A measuring apparatus according to claim 1, wherein the injecting means is a syringe and a pointed end of the syringe is connected to the circulating system through a valve.

7. A measuring apparatus according to claim 6, wherein the valve is a bi-directional valve.

8. A measuring apparatus according to claim 7, wherein one connecting inlet of the bi-directional valve is connected to the circulating system and another connecting inlet of the bi-directional valve is connected a container accommodating the liquid to be measured.

9. A measuring apparatus according to claim 7, wherein one connecting inlet of the bi-directional valve is connected to the circulating system and another connecting inlet of the bi-directional valve is connected to a transformer accommodating the liquid to be measured.

10. A measuring apparatus according to claim 1, which includes adjusting means for adjusting the temperature of the liquid to be measured so as to equal the temperature of the base liquid.

* * * * *